United States Patent [19]
Taylor

[11] 4,402,065
[45] Aug. 30, 1983

[54] INTEGRATED RAM/EAROM MEMORY SYSTEM

[75] Inventor: David L. Taylor, Carrollton, Tex.

[73] Assignee: Harris Corporation, Melbourne, Fla.

[21] Appl. No.: 242,658

[22] Filed: Mar. 11, 1981

[51] Int. Cl.³ .............................................. G11C 7/00
[52] U.S. Cl. ..................................... 365/189; 365/94
[58] Field of Search .................... 365/94, 95, 189, 221

[56] References Cited
U.S. PATENT DOCUMENTS
3,753,242  8/1973  Townsend ........................ 365/94 X Primary Examiner—Joseph A. Popek
Attorney, Agent, or Firm—Leitner, Palan, Martin & Bernstein

[57] ABSTRACT

An integrated circuit memory including a random memory (RAM) and a plurality of electrically alterable read only memories (EAROMS) having common controls. The data input for the RAM is either the system input or an EAROM and the data input for the EAROMS is only from the RAM. The system data output is from the RAM and the EAROMS.

10 Claims, 4 Drawing Figures

| FS | RAM | EAROM 1 | EAROM 2 | EAROM 3 | EAROM 4 | MUX |
|---|---|---|---|---|---|---|
| 1 | W | | | | | D IN |
| 2 | R | | | | | D IN |
| 3 | | R | | | | D IN |
| 4 | | | R | | | D IN |
| 5 | | | | R | | D IN |
| 6 | | | | | R | D IN |
| 7 | R | W | | | | D IN |
| 8 | R | | W | | | D IN |
| 9 | R | | | W | | D IN |
| 10 | R | | | | W | D IN |
| 11 | W | R | | | | D OUT |
| 12 | W | | R | | | D OUT |
| 13 | W | | | R | | D OUT |
| 14 | W | | | | R | D OUT |

| FS | RAM | EAROM 1 | EAROM 2 | EAROM 3 | EAROM 4 | MUX |
|----|-----|---------|---------|---------|---------|-------|
| 1  | W   |         |         |         |         | D IN  |
| 2  | R   |         |         |         |         | D IN  |
| 3  | R   | R       | R       | R       | R       | D IN  |
| 4  |     | R       | R       | R       | R       | D IN  |
| 5  | R   | W       |         |         |         | D IN  |
| 6  | R   |         | W       |         |         | D IN  |
| 7  | R   |         |         | W       |         | D IN  |
| 8  | R   |         |         |         | W       | D IN  |
| 9  | W   | R       |         |         |         | D OUT |
| 10 | W   |         | R       |         |         | D OUT |
| 11 | W   |         |         | R       |         | D OUT |
| 12 | W   |         |         |         | R       | D OUT |

INTEGRATED RAM/EAROM MEMORY SYSTEM

BACKGROUND OF THE INVENTION

The present invention relates generally to integrated circuit memories and more specifically to an integrated circuit memory including RAMS and EAROMS.

The versatility of random access memory (RAM) and of electrically alterable read only memories (EAROM) programmable read only memories (PROM) and read only memories (ROM) are well known throughout the industry. Random access memories are more versatile in operation, but require greater chip area, consume more power and are considered to be volatile. Electrically alterable, programmable and regular read only memories require less space. Their major limitation is the lack of versatility and operation. The EAROM, PROM and ROM type of devices are also well known for their non-volatility.

Although random access memories and various types of read only memories have been used in computation systems as independent and distinct units taking advantage of their various properties, there has been to date, no single integrated circuit which appears to the outside to be a random access memory having the storage capacity, power consumption and speed closer to a read only memory.

SUMMARY OF THE INVENTION

An object of the present invention is to provide a random access memory having increased storage capacity.

A further object of the present invention is to provide a random access memory having the non-volatility of read only memories.

Still another object of the present invention is to provide a read only memory having the versatility of a random access memory.

These and other objects of the invention are attained by forming integrated on a single chip a random access memory and a plurality of electrically alterable read only memories. The support devices including addressing and output sensing are common to all the memories on the chip. The input to the random access memory may be either the system input or the output from one of the electrically alterable read only memories. The input to the electrically alterable memories may be from the output of the random access memory. The output of the system may be from the random access memory or one of the electrically alterable memories. The system may have a single serial output or a plurality of parallel outputs. Function select logic is provided to control a plurality of input-output ports connected to the output of the electrically alterable read only memories and the input and output of the random access memory. The addressing uses a memory select control and a common memory location addressing for the bit.

Other objects, advantages and novel features of the present invention will become apparent from the following detailed description of the present invention when considered in conjunction with the accompanying drawings.

DESCRIPTION OF THE PREFERRED EMBODIMENTS

Figures 1, 2:
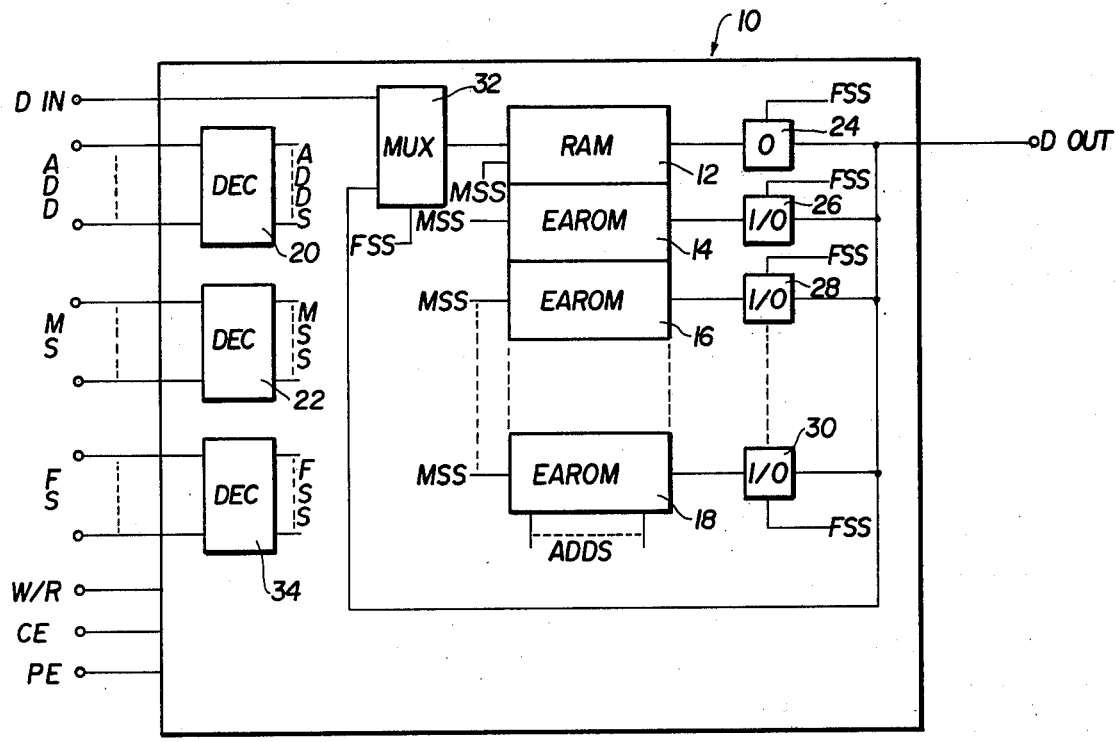
FIG. 1 is a block diagram of an integrated memory system incorporating the principles of the present invention having a single serial output.
FIG. 2 is a table of the function select decoding for a memory of FIG. 1 having a RAM and four electrically alterable ROMS.

An integrated circuit incorporating the versatility of a random access memory and electrically alterable read only memories is illustrated in FIG. 1 as 10. The memory system includes a random access memory (RAM) 12 and a plurality of electrically alterable read only memories (EAROMS) 14, 16 and 18. A data input pin (DIN) and a data output pin (DOUT) provide a serial in, serial out memory system. The other pins include a power enable terminal (PE), a chip enable terminal (CE), a write/read terminal (W/R) and addressing and function select terminals. The addressing includes a plurality of memory select terminals (MS) to select the appropriate memory units 12 through 18 and a location of the data cell within each memory or location addressed (ADD). As will be explained more fully below, these inputs and outputs are common for the memory units and thus reduces the required auxiliary devices for the operation of the memory system 10. Function select terminals (FS) define the data transfer within and out of the memory system 10. The data address location ADD is decoded by decoder 20 (DEC) and is provided a common address signal to all of the memories as an address signal ADDS. The signal on memory select terminals MS were decoded by decoder 22 and are provided a memory select signal MSS to select the appropriate memory 12 through 18 to be written into or read from. The function select (FS) is decoded by decoder 34 and is provided as a function select signal FSS to a plurality of control devices to be explained.

The output of the RAM 12 is connected to the output terminal Dout by output device 24. Similarly, each of the electrically alterable ROMS 14, 16 and 18 are connected to the output terminal by input-output (I/O) ports 26, 28 and 30. The input-output (I/O) ports 26, 28 and 30 are also connected as input to a multiplexer (Mux) 32. The other input to the multiplexer 32 is the data input Din. The output of the multiplexer (Mux) 32 is connected as the input of the RAM. The multiplexer 32 is considered a two-to-one multiplexer. The input-output (I/O) ports 26, 28 and 30 allow data to be read from the electrically alterable ROMS 14, 16, 18 directly to the output port of the system Dout as well as being provided as an input to the multiplexer 32. Similarly, the output of the RAM 12 may be provided as an input to the electrically alterable ROMS 14, 16 and 18 through the respective input-output (I/O) ports 26, 28 and 30. The function select signals FSS control output switching element 24 for the RAM, input-output (I/O) ports 26, 28 and 30 for the electrically alterable ROMS and the multiplexer Mux 32 to define data transfers into, within and out of the memory system 10. The data location is defined by the address signal ADDS and the memory unit by memory select signal MSS.

To further explain the operation of the integrated circuit 10, a system including a RAM 12 and four electrically alterable ROMS will be explained relative to the table in FIG. 2. Fourteen functions may be selected as illustrated. For the first function, the output device 24, and the input-output (I/O) ports are all set high to prevent any output from the RAM as well as preventing any input or output to the EAROMS. The addressing and memory select signal may define a location in RAM 12 to be written into for the first function select. For the second function select, the RAM is read through output gate 24 to the system output Dout while the input-output (I/O) ports for the EAROMS are disabled. For the third, fourth, fifth and sixth function selects, the data location selected by the address signals ADDS are read from EAROMS 1, 2, 3 and 4, respectively, using the appropriate memory select signal MSS. The function select enables the appropriate input-output (I/O) port to provide an output function. It should be noted that during the second through the sixth functions, the individual memory elements are read and provide an output to the system output Dout. As indicated for the multiplexer select, for these first six function selects, the input to the RAM will always be from the data input Din of the system. While the output devices are all disabled, the multiplexer is controlled such that the input of the RAM is from the data input.

For the seventh, eighth, ninth and tenth functions, the selected location of the RAM is read and provided as an input to the EAROM 1, 2, 3 and 4, respectively. For example, in response to the seventh function select signal, the address location of the RAM 12 is read and provided as an output through output switch 24 and as an input through input-output (I/O) port 26 to electrically alterable ROM 14 at the same address location. For the eighth function select, the data is transferred from the address of RAM 12 to EAROM 2, for the ninth function 9 from the RAM and EAROM 3 and for the tenth function select from the RAM to EAROM 4. It should also be noted that the multiplexer is controlled such that the input to the RAM is from the system input Din.

For the eleventh, twelfth, thirteenth and fourteenth function selects, the input to the RAM is an output from a selected EAROM. Thus, for the four function selects, the multiplexer Mux 32 is controlled such that the input to the RAM 12 is from the system output Dout and not from the system input Din. This is indicated specifically in the table of FIG. 2. For example, the eleventh function select reads data located at a specific address in EAROM 1 and provides it as an output through input-output (I/O) port 26 as an input to the multiplexer Mux 32. The multiplexer 32 selects the output of the system 32 as the input to the RAM 12. The memory select MS selects the RAM as the memory select during the write part of the cycle after the read part cycle for the EAROM 14. The twelfth function select is similar to that of the eleventh except that EAROM 2 is read and is provided as an input to the RAM. The thirteenth function select reads EAROM 13 and provides that as an input to the RAM and the fourteenth function select reads EAROM 4 and provides an input to the RAM.

Generally, a RAM cell has a size of approximately six mils squared and an EAROM has a cell size of 1.5 mils squared. Thus a four-to-one factor is provided. For the combined RAMS/EAROMS having 1K of RAMS and 4K of EAROMS the total array area would be 12K mils squared. This would be equivalent to 2K of RAM. By using the RAM as the main input and output memory with additional inputs being provided to the RAM from the EAROMS, the versatility of the RAM can be used with the speed and small surface area of the EAROM. Similarly, the EAROMS may be read directly out of the system providing even greater read speed. The use of a common address technique minimizes the amount of space required for associate devices and maximizes the amount of space available for memory storage locations. Also, it should be noted that by providing a majority of the storage in EAROMS, the non-volatility of the system is greatly increased. To the outside world, the system 10 appears to have the versatility of a RAM while having some of the speed and non-volatility of an EAROM. Although an EAROM is illustrated, EAROMS in combination with PROMS and ROMS may also be used. This will reduce the versatility of the system, but not all of the read only memories need be electrically alterable for most practical applications.

Figures 3, 4:
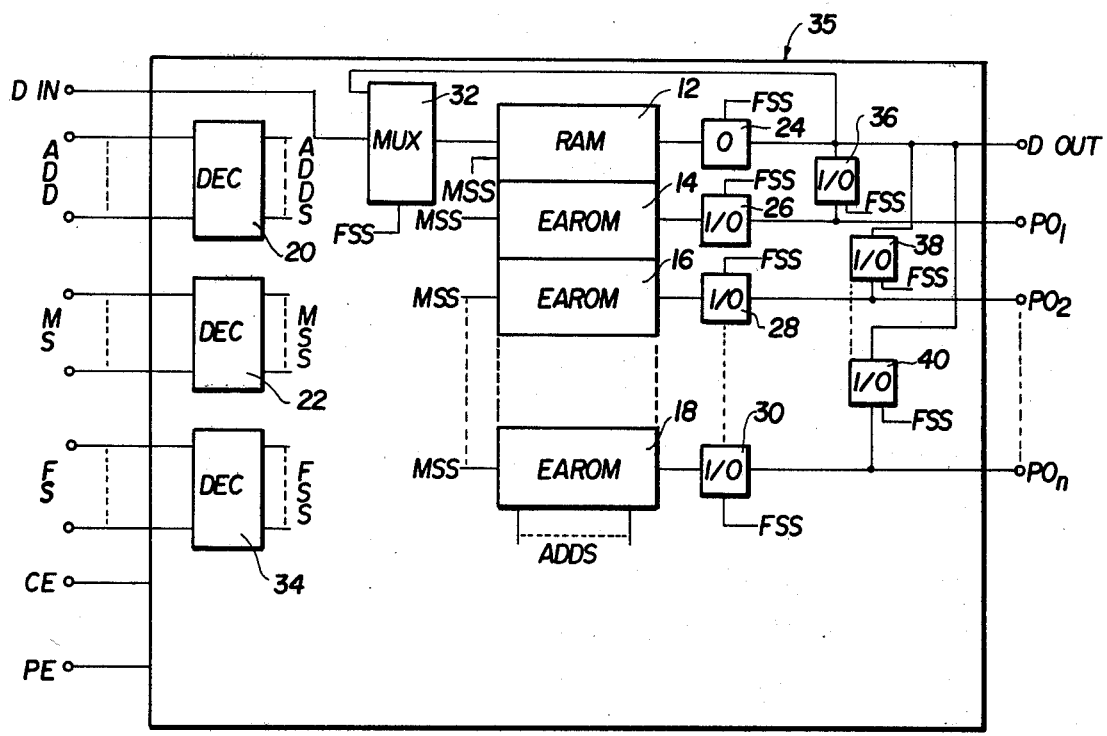
FIG. 3 is a block diagram of an integrated memory system incorporating the principles of the present invention having parallel outputs.
FIG. 4 is a table of the function select decoding for a memory of FIG. 3 having a RAM and four electrically alterable ROMS.

For some applications, it is desirable to have a parallel instead of serial output. A serial in parallel out memory system is illustrated in FIG. 3 as integrated memory circuit 35. The numbering of common elements of FIG. 1 and FIG. 3 are the same. The major difference in pins between the integrated memory circuit 10 and 35 is that the circuit 35 includes a plurality of outputs Po1 through Pon for the individual EAROMS. Further, by providing the individual outputs pins Po1 through Pon, additional interconnection and isolation of the outputs of the EAROMS and the output of the RAM is needed. This is illustrated as including additional input-output (I/O) ports 36, 38 and 40 connecting the output of input-output (I/O) ports 26, 28 and 30, respectively, to the output of the RAM 12 and the system Dout. As in FIG. 1, the output Dout is provided as one of the inputs to the multiplexer Mux 32. The operation of the elements of the integrated memory 35 of FIG. 3 is similar to that of integrated 10 of FIG. 1 and the differences will be explained relative to the table of FIG. 4.

As in the table of FIG. 2, the first function select disables the output switch 24 from the RAM and all input-output (I/O) ports allowing the RAM to be written into with the multiplexer providing the system input Din at the data input to the RAM 12. For the second function select, the RAM is read and the I/O ports 26, 28, 30, 36, 38 and 40 are disabled. For the third function select the RAM and all four of the EAROMS are read and are provided as a parallel output to output Dout and Po1, Po2, Po3, and Po4, respectively. For this operation, the first set of input-output (I/O) ports 26, 28 and 30 as well as one for EAROM 3 operate as output ports. The interconnecting input-output (I/O) ports 36, 38, 40 and one for EAROM 3 prevent interconnection of the output of the EAROM to the output of the RAM. For the fourth function select the I/O ports 26, 28, 30, 36, 38 and 40 have the same operation as they do for the third function select to provide individual outputs in a parallel relationship without interconnecting it to the output of the RAM. For the fourth function select, the RAM 12 is not read out and consequently, output port 24 is disabled.

For the next fifth, sixth, seventh and eighth function selects, the RAM is read and provided as an input to a selected EAROM. For example, the fifth function select reads the addressed location of RAM and provides it as an output through output switch 24 and as an input to EAROM 14 through input-output ports 36 and 26. As before, the memory select signal MSS selects the RAM during a read cycle and EAROM during the write cycle. The sequence is repeated for the sixth function select wherein data is read from the RAM into EAROM 2 through I/O ports 38 and 28, for the seventh function select into EAROM 3 through a pair of I/O ports and for the eighth function select into EAROM 4 through I/O ports 40 and 30.

For the ninth, tenth, eleventh and twelfth function selects, data at the address in a selected EAROM is read therefrom and transferred as an input to be written into the same address of the RAM. For the ninth function select, the memory select signal MSS selects EAROM 14 to be read from a desired address and provided as an output through I/O ports 26 and 36 and as an input to multiplexer Mux 32. The memory select signal MSS then selects RAMS 12 and a write cycle is performed wherein the multiplexer Mux 32 has been controlled to provide the input to the RAM from the output from the system output Dout. This is repeated for the tenth, eleventh and twelfth function selects wherein EAROM 2, 3 and 4, respectively, are addressed and read and the read data is provided as an input to the multiplexer Mux 32 through an appropriate pair of I/O ports to be written into the RAM 12.

Thus, it can be seen that the integrated memory 35 is similar to that of 10 with the exception of being able to provide the output from the EAROMS in a parallel relationship instead of the serial relationship of integrated circuit 10. It should be noted that function selects as illustrated in FIGS. 2 and 4 are mere examples of assignments of decoded values and their operations. Obviously, other operations and decoder systems may be used. The use of I/O ports are convenient elements which provide the appropriate control, while minimizing auxiliary devices needed.

As is evident from the description of the preferred embodiments, the objects of the invention are attained in that an integrated circuit memory is provided with the versatility of a RAM and the capacity and non-volatility of ROMS. Although the invention has been described and illustrated in detail, it is to be clearly understood that the same is by way of illustration and example only and is not to be taken by way of limitation. The spirit and scope of the present invention are to be limited only by the terms of the appended claims.

What is claimed:

1. A memory system integrated on a single chip having a system input and output comprising:
a random access memory unit having an input connected to the system input and an output connected to the system output;
a plurality of alterable read only memory units having inputs and outputs;
first means for interconnecting the output of said random access memory unit to the inputs of said alterable read only memory units;
second means for interconnecting the outputs of said alterable read only memory units to the input of said random access memory unit; and
select means coupled to said first and second means for selecting the output of said random access memory unit as the input for one of said alterable read only memories or selecting the output of one of said alterable read only memories as the input for said random access memory.

2. A memory system according to claim 1 including means for addressing memory locations in said random access memory and said plurality of alterable read only memories and means for controlling the writing and reading of data from and into said random access memory and said plurality of alterable read only memories.

3. An integrated circuit memory system according to claim 2 wherein said addressing means is common for all of said memories and includes memory unit selection as well as memory location addressing.

4. A memory system according to claim 1 including a third means for interconnecting the system input and the output of said second means to the input of said random access memory and said select means is coupled to said third means for selecting the system input or the output of said second means as the input to said random access memory.

5. A memory system according to claim 4 wherein the output of said second means is connected to the system output, and said select means selects which memory unit is read and whether the read data is a system output or an input to one of the other memory units.

6. A memory system according to claim 5 wherein said first and second means in combination includes a plurality of input-output ports, one for each of said alterable read only memories and said third means is a two-to-one multiplexer.

7. A memory system according to claim 4 wherein said system includes a plurality of system outputs said first and second means in combination includes a plurality of first output-input ports for connecting a respective alterable read only memory to an individual system output, and a plurality of second input-output ports for connecting the output of said random access memory to a respective first input-output port and for connecting a respective first input-output port to said third means; and said random access memory has an individual system output.

8. A memory system according to claim 1 wherein the output of said second means is connected to the system output, and said select means selects which memory unit's data is read and whether the read data is a system output or an input to one of the other memory units.

9. A memory system according to claim 1 wherein said first and second means in combination includes a plurality of input-output ports connecting a respective alterable read only memory to the input or output of said random access memory.

10. A memory system according to claim 1 wherein said system includes a plurality of outputs, said first and second means in combination includes a plurality of first input-output ports for connecting a respective alterable read only memory to an individual system output, and a plurality of second input-output ports connecting a respective first input-output port to the input or output of said random access memory; and said random access memory has an individual system output.

* * * * *